(12) United States Patent
Lee

(10) Patent No.: US 7,700,449 B2
(45) Date of Patent: Apr. 20, 2010

(54) FORMING ESD DIODES AND BJTS USING FINFET COMPATIBLE PROCESSES

(75) Inventor: Jam-Wem Lee, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 42 days.

(21) Appl. No.: 12/143,644

(22) Filed: Jun. 20, 2008

(65) Prior Publication Data

US 2009/0315112 A1 Dec. 24, 2009

(51) Int. Cl.
*H01L 21/336* (2006.01)

(52) U.S. Cl. .............................. 438/299; 257/E21.136; 257/350; 257/355

(58) Field of Classification Search ................. 438/197, 438/299; 257/350, 355, E21.136
See application file for complete search history.

(56) References Cited

U.S. PATENT DOCUMENTS

| 7,173,310 B2 * | 2/2007 | Voldman et al. ............ 257/350 |
| 2004/0188705 A1 * | 9/2004 | Yeo et al. .................... 257/170 |

OTHER PUBLICATIONS

Russ, C. C., et al., "ESD Evaluation of the Emerging MuGFET Technology," IEEE Transactions on Device and Materials Reliability, vol. 7, No. 1, Mar. 2007, pp. 152-161.
Gossner, H., et al., "Novel Devices in ESD Protection," Physics of Semiconductor Devices, 2007. IWPSD 2007. International Workshop on Dec. 16-20, 2007, 6 pages, IEEE.

* cited by examiner

*Primary Examiner*—W. David Coleman
*Assistant Examiner*—Christine Enad
(74) *Attorney, Agent, or Firm*—Slater & Matsil, L.L.P.

(57) ABSTRACT

A method of forming an electrostatic discharging (ESD) device includes forming a first and a second semiconductor fin over a substrate and adjacent to each other; epitaxially growing a semiconductor material on the first and the second semiconductor fins, wherein a first portion of the semiconductor material grown from the first semiconductor fin joins a second portion of the semiconductor material grown from the second semiconductor fin; and implanting a first end and a second end of the semiconductor material and first end portions of the first and the second semiconductor fins to form a first and a second implant region, respectively. A P-N junction is formed between the first end and the second end of the semiconductor material. The P-N junction is a junction of an ESD diode, or a junction in an NPN or a PNP BJT.

19 Claims, 8 Drawing Sheets

US 7,700,449 B2

FORMING ESD DIODES AND BJTS USING FINFET COMPATIBLE PROCESSES

TECHNICAL FIELD

This invention relates generally to an electrostatic discharge (ESD) protection circuits, and more particularly to the ESD protection circuits formed using FinFET compatible processes.

BACKGROUND

It is well known that extremely high voltages can develop in the vicinity of an integrated circuit due to the build-up of static charges. A high potential may be generated to an input or output buffer of the integrated circuit, which may be caused by a person touching a package pin that is in electrical contact with the input or output buffer. When the electrostatic charges are discharged, a high current is produced at the package nodes of the integrated circuit, and is referred to electrostatic discharge (ESD). ESD is a serious problem for semiconductor devices since it has the potential of destroying the entire integrated circuit.

The duration of the ESD transient is very short, typically in the order of nanoseconds, and the conventional circuit breakers cannot react quickly enough to provide adequate protection. For this reason, it has become a known practice to incorporate ESD devices in integrated circuits. Conventionally, bi-directional diode strings were coupled between the package pins to protect the respective circuit. Other ESD devices such as transistors were also used. The ESD devices were also widely used between power lines to protect the internal circuits coupled between power lines and to discharge ESD currents to the ground.

FinFET is the most attractive candidate for sub N32 technology. To make the process for forming ESD devices compatible with the formation of FinFET structures, FinFETs were conventionally used to construct the ESD protection circuits, wherein the channels of the ESD FinFETs were used for conducting ESD currents. This approach, unfortunately, faces design and process issues. First, to provide a high ESD protection capability, a great number of FinFET devices, sometimes as many as over 10,000 FinFETs, were connected in parallel. This means that the breakdown of any one of these finFETs may cause the entire ESD protection circuit to malfunction. One way for solving this issue is to make all FinFETs identical, so that they can be turned on simultaneously. However, due to process reasons, this is very difficult to achieve. To solve this problem, a RC network may be used to bias the gates of the ESD FinFET devices, as is shown in FIG. 1, wherein resistor R1, capacitor C1, and inverter Inv1 are provided to bias FinFET 2. The output of inverter Inv1 is connected to gate 4 of FinFET 2. Vdd is connected to the drain, and Vss is connected to the source of FinFET 2. With the bias voltage applied on the gate of ESD FinFET 2, FinFET 2 is unlikely to go into the snapback mode, and hence more ESD FinFETs can be tuned on simultaneously. However, the RC network itself occupies large chip area and may result in false actions during a normal operation mode. Thus, the RC network is only suitable for power clamps, not for I/O protections.

Accordingly, what is needed in the art is an ESD protection device whose formation process is compatible with the formation of FinFETs while at the same time overcoming the deficiencies of the prior art.

SUMMARY OF THE INVENTION

In accordance with one aspect of the present invention, a method of forming an electrostatic discharging (ESD) device includes forming a first and a second semiconductor fin over a substrate and adjacent to each other; epitaxially growing a semiconductor material on the first and the second semiconductor fins, wherein a first portion of the semiconductor material grown from the first semiconductor fin joins a second portion of the semiconductor material grown from the second semiconductor fin; implanting a first end of the semiconductor material and first end portions of the first and the second semiconductor fins to form a first implant region; and implanting a second end of the semiconductor material and second end portions of the first and the second semiconductor fins to form a second implant region. A P-N junction is formed between the first end and the second end of the semiconductor material.

In accordance with another aspect of the present invention, a method of forming an ESD device includes providing a semiconductor substrate; forming a first and a second semiconductor fin over the substantially substrate, wherein the first and the second semiconductor fins are higher than shallow trench isolation (STI) regions, and are parallel to each other; and epitaxially growing a semiconductor material on the first and the second semiconductor fins. Portions of the semiconductor material grown from the first and the second semiconductor fins adjoin each other to form a continuous semiconductor region. The semiconductor material grows from substantially entireties of the first and the second semiconductor fins. The method further includes implanting a first end portion of the continuous semiconductor region to a first impurity concentration to form a first implant region; and implanting a second end portion of the continuous semiconductor region to a second impurity concentration to form a second implant region. A middle portion of the continuous semiconductor region has an impurity concentration lower than the first and the second impurity concentrations.

In accordance with yet another aspect of the present invention, a method of forming an ESD device includes providing a semiconductor substrate having a first region and a second region; forming STI regions in the semiconductor substrate; forming a first and a second semiconductor fin over the semiconductor substrate and in the first region, wherein the first and the second semiconductor fins extend higher than the STI regions, and are parallel to each other; forming a third and a fourth semiconductor fin over the semiconductor substrate and in the second region, wherein the third and the fourth semiconductor fins are higher than the STI regions, and are parallel to each other; blanket forming a gate dielectric layer on the first, the second, the third, and the fourth semiconductor fins; blanket forming a gate electrode layer on the gate dielectric layer; patterning the gate dielectric layer and the gate electrode layer to remove the gate dielectric layer and the gate electrode layer from substantially over an entirety of the first and the second semiconductor fins, wherein a portion of the gate dielectric layer and a portion of the gate electrode layer is left to cover middle portions of the third and the fourth semiconductor fins; epitaxially growing a semiconductor material on exposed portions of the first, the second, the third, and the fourth semiconductor fins, wherein portions of the semiconductor material grown from the first and the second semiconductor fins join each other to form a continuous semiconductor region, and portions of the semiconductor material grown from a same end of the third and the fourth semiconductor fins join each other to form a common source/drain region; implanting a first end portion of the continuous semiconductor region to form a first implant region; implanting a second end portion of the continuous semiconductor region to form a second implant region; and implanting the common source/drain region.

In accordance with yet another aspect of the present invention, an ESD device includes a substrate; and a first and a second semiconductor fin over the substrate and adjacent to each other. Each of the first and the second semiconductor fins includes a first and a second end portion, and a middle portion between the first and the second end portions. The ESD device further includes a semiconductor material covering and adjoining top surfaces and sidewalls of the first and the second semiconductor fins, wherein the semiconductor material covers substantially entireties of the first and the second semiconductor fins; a first implant region including a first end portion of the semiconductor material, wherein the first implant region has a first impurity concentration; a second implant region including a first second portion of the semiconductor material, wherein the second implant region has a second impurity concentration; and a middle region including a middle portion of the semiconductor material between and adjoining the first and the second implant regions, wherein the middle region has a third impurity concentration lower than the first and the second impurity concentrations.

In accordance with yet another aspect of the present invention, an ESD device includes a substrate; a first and a second semiconductor fin over the substrate and adjacent to each other, wherein each of the first and the second semiconductor fins includes a first and a second end portion, and a middle portion between the first and the second end portions; a semiconductor material covering and adjoining top surfaces and sidewalls of the first and the second semiconductor fins, wherein the semiconductor material is over and contacting substantially entireties of the first and the second semiconductor fins; a first implant region, wherein a first end portion of the semiconductor material is a portion of the first implant region, and wherein the first implant region has a first impurity concentration; a second implant region, wherein a second end portion of the semiconductor material is a portion of the second implant region, and wherein the second implant region has a second impurity concentration; and a middle region including a middle portion of the semiconductor material between and adjoining the first and the second implant regions. The middle region has a third impurity concentration lower than the first and the second impurity concentrations.

In accordance with yet another aspect of the present invention, an ESD device includes a semiconductor substrate; isolation strips in the semiconductor substrate; a semiconductor layer over the semiconductor substrate and the isolation strips; air-gap strips underlying the semiconductor layer, wherein the air-gap strips are parallel to each other, with each of the air-gap strips directly over one of the isolation strips; a first doped region in the semiconductor layer, wherein the first doped region has a first conductivity type; and a second doped region in the semiconductor layer. The second doped region has a second conductivity type opposite the first conductivity type. The first and the second doped region adjoin each other to form a P-N junction. The P-N junction is substantially vertical and extends in a direction perpendicular to lengthwise directions of the air-gap strips.

The advantageous features of the present invention include improved ESD currents that may flow through the ESD devices and compatibility with existing FinFET fabrication processes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel electrostatic discharging (ESD) device and the method of forming the same are provided. The intermediate stages of manufacturing embodiments of the present invention are illustrated. The variations of the embodiments are then discussed. Throughout the various views and illustrative embodiments of the present invention, like reference numbers are used to designate like elements.

Figure 1:
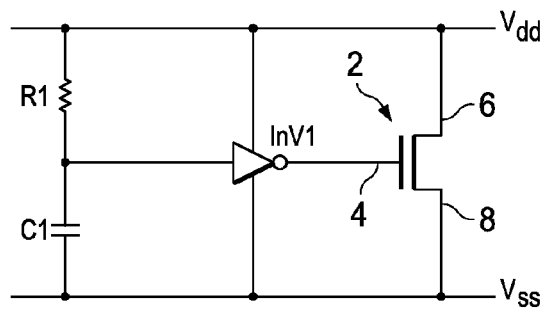
FIG. 1 illustrates a conventional FinFET protection device biased by a RC device.
Figure 2:
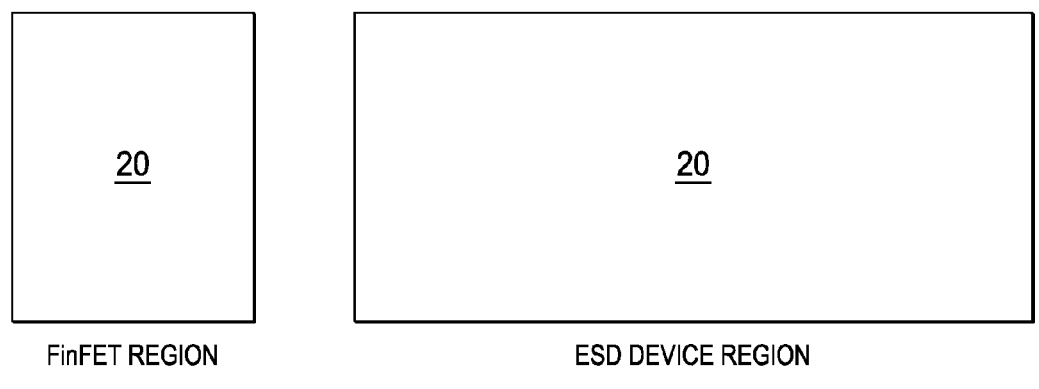
FIGS. 2 through 10 are views of intermediate stages in the manufacturing of embodiments of the present invention.

FIG. 2 illustrates a cross-sectional view of substrate 20, which includes a FinFET region and an ESD device region. The FinFET device region may be a core circuit region, an input/output (IO) device region, or the like. The ESD device region is used for forming an ESD device. Preferably, substrate 20 comprises bulk silicon. Alternatively, substrate 20 comprises bulk silicon germanium (SiGe) or other semiconductor materials. Substrate 20 may be doped with a p-type or an n-type impurity, depending on the types of the resulting FinFET and ESD device.

Figure 3:
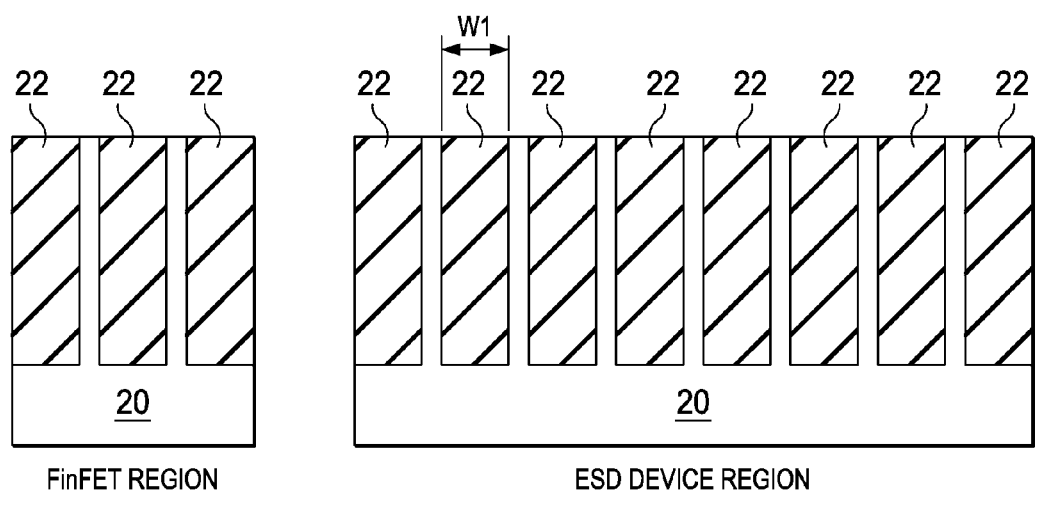

Referring to FIG. 3, shallow trench isolation (STI) regions 22 are formed on substrate 20. As is known in the art, STI regions 22 may be formed by etching substrate 20 to form recesses, and then filling the recesses with dielectric materials, such as high-density plasma (HDP) oxides, TEOS oxides, or the like. The width W1 of STI regions 22 may be less than about 100 nm. One skilled in the art will realize, however, that the dimensions recited throughout the description are merely examples, and will change if different formation technologies are used.

Figure 4A:
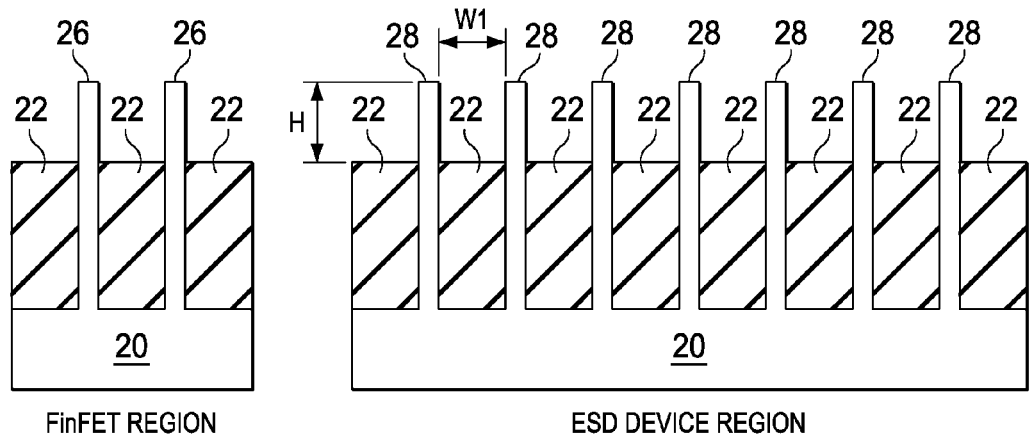
Figure 4B:
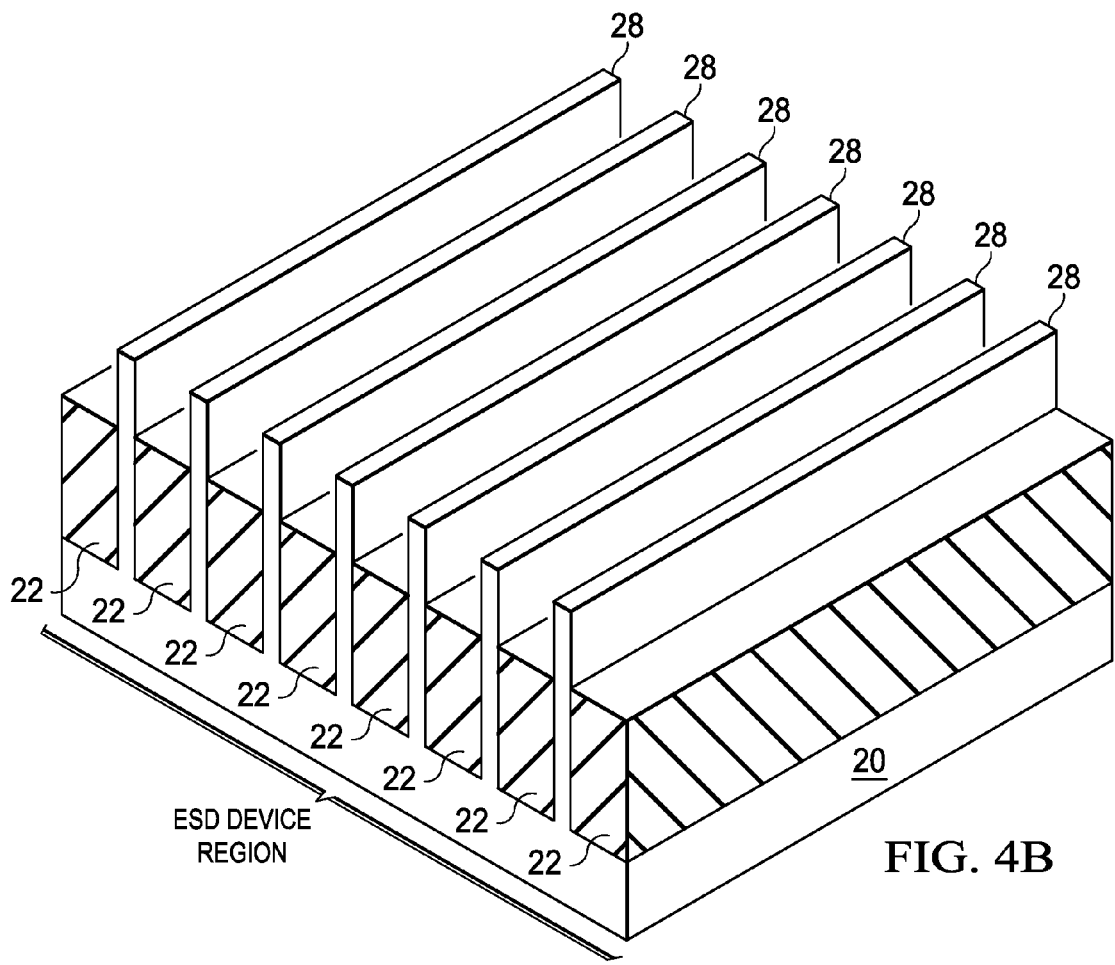

FIGS. 4A and 4B illustrate the formation of fins 26 and 28. FIG. 4A is a cross-sectional view, while FIG. 4B is a perspective view of a portion of the structure shown in FIG. 4A, wherein only the ESD device region is shown. The perspective view of the FinFET region is similar to the ESD device region. Fins 26 and 28 may be formed by recessing the top surfaces of STI regions 22, and hence leaving fins 26 and 28. Alternatively, fins 26 and 28 are formed by epitaxially growing from the semiconductor strips between STI regions 22. In an exemplary embodiment, height H of fins 26 and 28 are between about 20 nm and about 100 nm, and a ratio of height H to width W1 is between about 1 and about 10.

Figure 5:
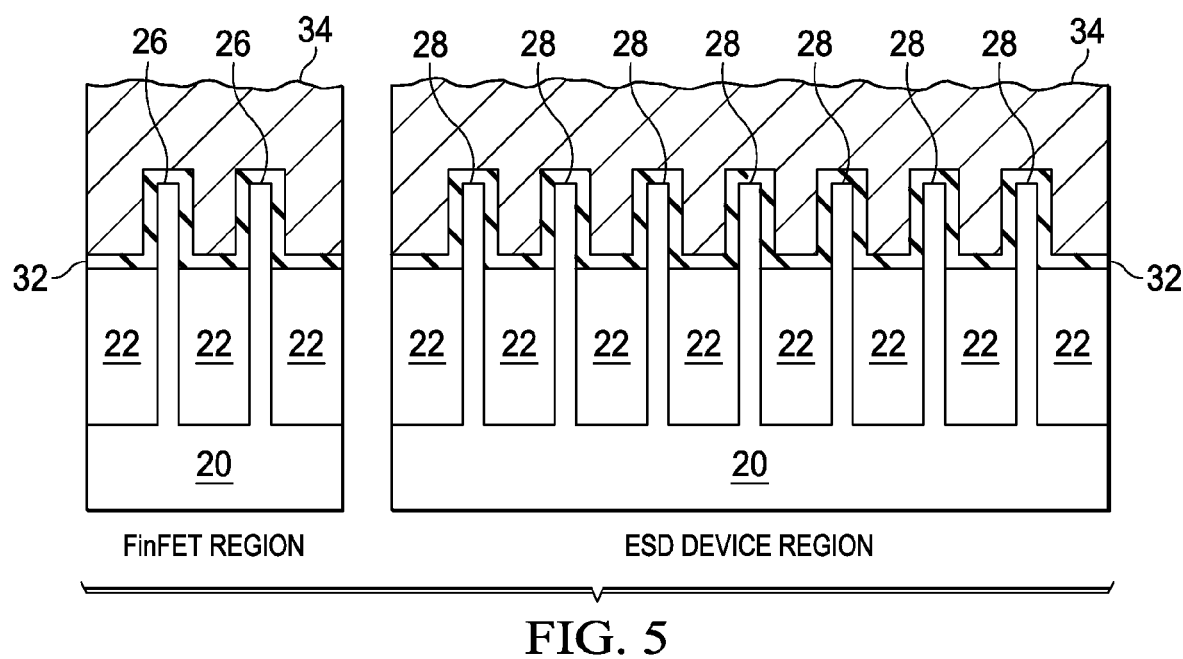

In FIG. 5, gate dielectric layer 32 and gate electrode layer 34 are blanket formed in the FinFET region and the ESD device region, and cover fins 26 and 28. Gate dielectric layer 32 may include commonly used dielectric materials such as oxides, nitrides, oxynitrides, high-K dielectrics such as $Ta_2O_5$, $Al_2O_3$, HfO, $Ta_2O_5$, $SiTiO_3$, HfSiO, HfSiON, ZrSiON, and combinations thereof. Gate electrode layer 34 is formed on gate dielectric layer 32, and may be formed of polysilicon. Alternatively, gate electrode layer 34 may be formed of other commonly used conductive materials, including metals such as Ni, Ti, Ta, Hf, and combinations thereof, metal silicides such as NiSi, MoSi, HfSi, and combinations thereof, and metal nitrides such as TiN, TaN, HfN, HfAlN, MoN, NiAlN, and combinations thereof.

Figure 6A:
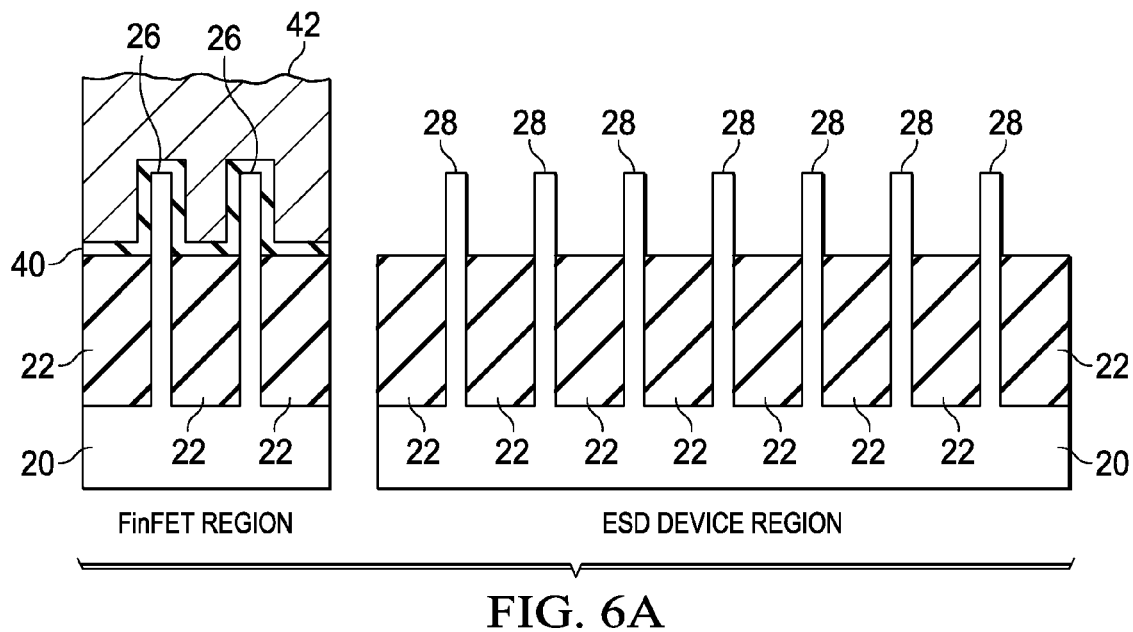
Figure 6B:
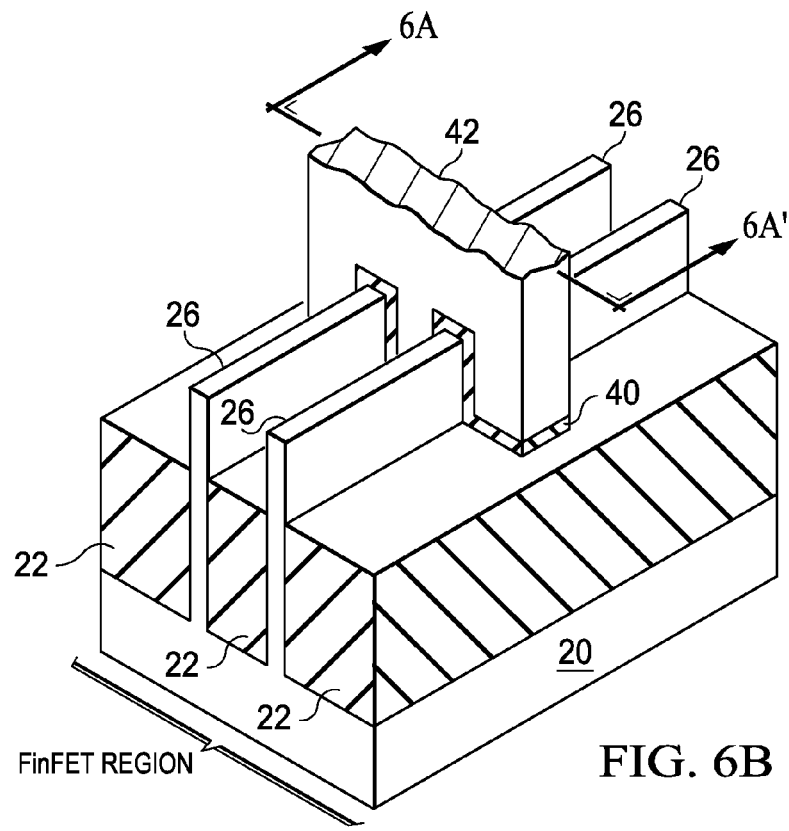

Next, as shown in FIG. 6A, gate dielectric layer 32 and gate electrode layer 34 are patterned. FIG. 6A illustrates a cross-sectional view taken along a vertical plane crossing remaining portions of gate dielectric layer 32 and gate electrode layer 34, which is the same plane crossing line A-A' in FIG. 6B. As shown in FIG. 6B, which illustrates a perspective view of the FinFET region, portions of gate dielectric layer 32 and gate electrode layer 34 are left, forming gate dielectric 40 and gate electrode 42 of the resulting FinFET device. In the ESD device region (not shown in FIG. 6B, refer to FIG. 6A), gate dielectric layer 32 and gate electrode layer 34 are fully removed, and fins 28 are exposed again. In subsequent steps, gate spacers (not shown) are formed on the sidewalls of gate dielectric 40 and gate electrode 42, while no gate spacers are formed on the sidewalls of fins 26 and 28.

Figure 7A:
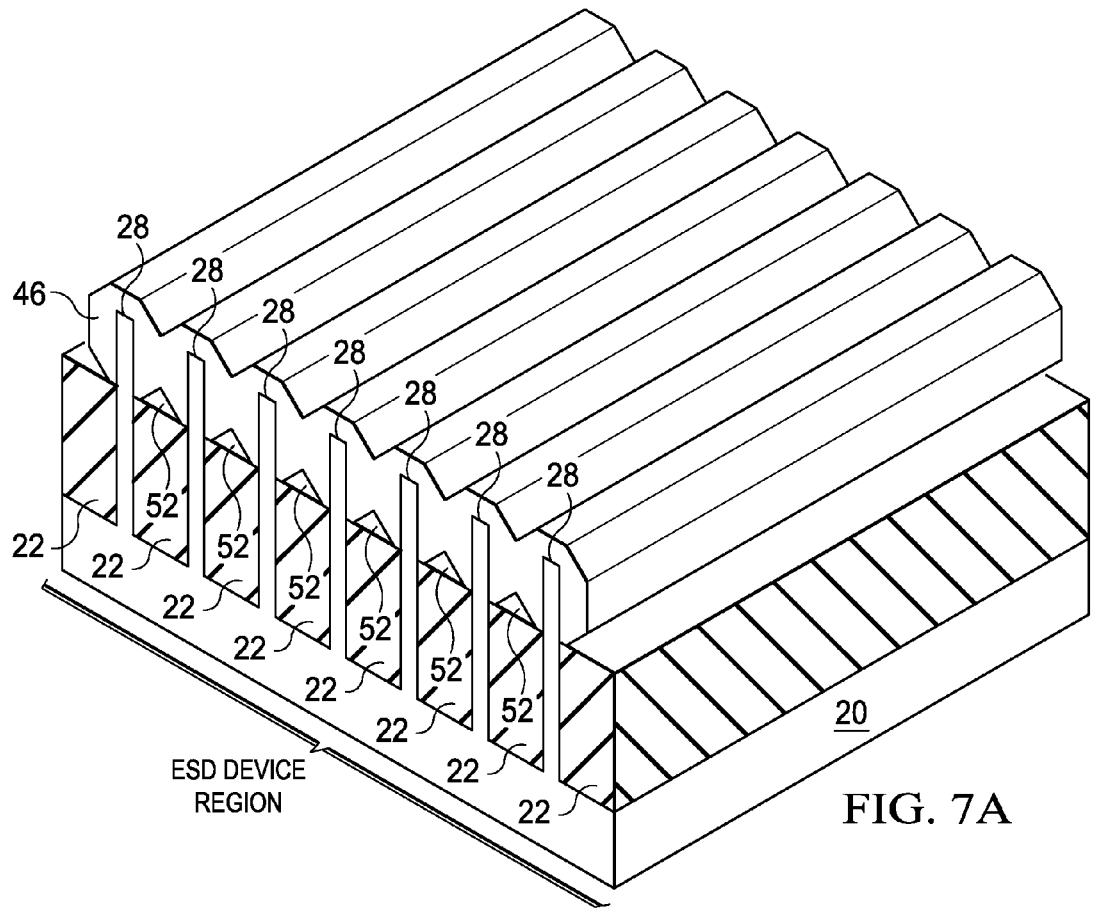
Figure 7B:
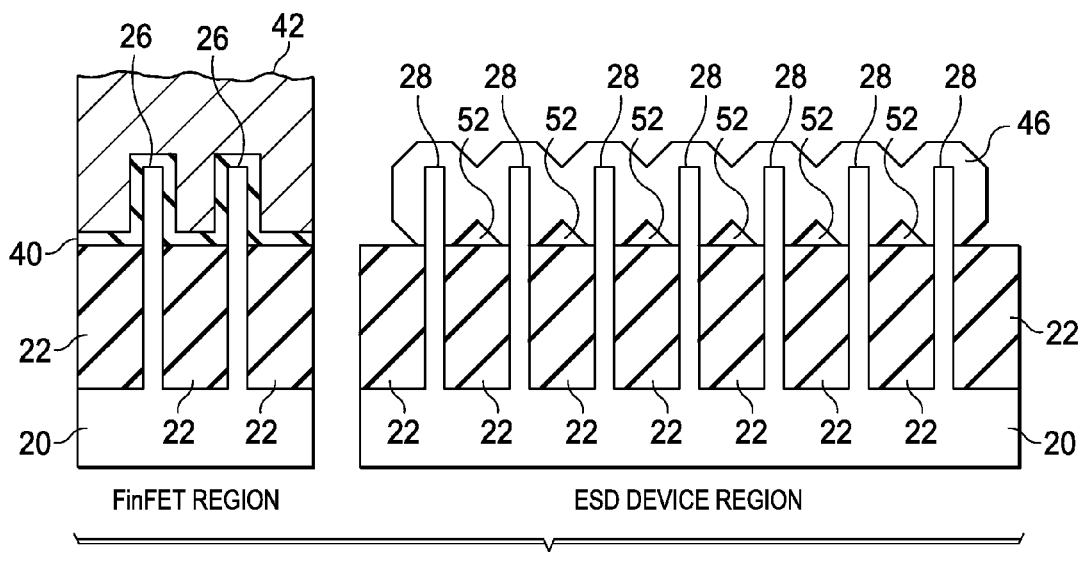
Figure 7C:
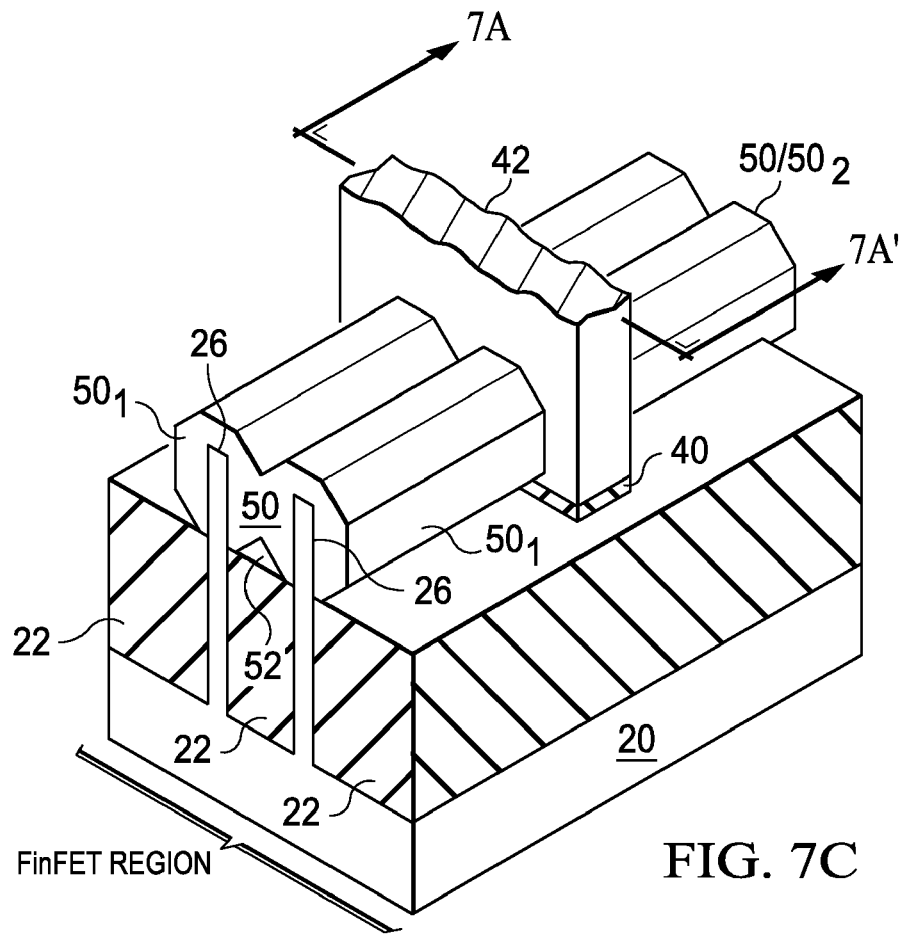

Next, as shown in FIGS. 7A, 7B, and 7C, a selective epitaxial growth is performed to form semiconductor material 46. FIG. 7A illustrates a perspective view of the resulting structure in the ESD device region. In an embodiment, semiconductor material 46 is formed of the same as the material of substrate 20, and is epitaxially grown on fins 26 and 28. In alternative embodiments, semiconductor material 46 is formed of a material different from that of substrate 20. For example, in the case the FinFET in the resulting FinFET region is a p-type FinFET, semiconductor material 46 may include silicon germanium (SiGe). Alternatively, in the case the resulting FinFET in the FinFET region is an n-type FinFET, semiconductor material 46 may include silicon carbon (SiC). The epitaxial growth includes vertical growth and horizontal growth, and the portion of semiconductor material 46 grown from one of the fins 28 eventually join the portion of semiconductor material 46 grown from a neighboring fin 28. In the resulting structure, as shown in FIGS. 7A and 7B, in the ESD device region, the epitaxially grown semiconductor material 46 forms a continuous region.

During the growth of semiconductor material 46, a p-type impurity or an n-type impurity may be in-situ doped, and hence the resulting semiconductor material 46 may be of p-type or n-type. The impurity concentration of semiconductor material 46 may be between about $1E13/cm^3$ and about $1E19/cm^3$.

Referring to FIG. 7C (Please note that FIG. 7B is a cross-sectional view taken along the vertical plane crossing line A-A' in FIG. 7C.), which is perspective view of the FinFET region, no semiconductor material is grown on gate dielectric 40 and gate electrode 42 during the selective epitaxial growth. However, semiconductor material 50 is grown on exposed portions of fins 26 simultaneous with the growth of semiconductor material 46 (refer to FIG. 7B). Semiconductor material 50 will form the future source and drain regions. In an embodiment, the neighboring source regions 50$_1$ of the neighboring FinFETs are connected by semiconductor material 50, and the neighboring drain regions 50$_2$ of the neighboring FinFETs are connected by semiconductor material 50, as shown in the perspective view in FIG. 7C. The gates 42 of neighboring FinFETs are also interconnected. Therefore, the neighboring FinFETs are connected in parallel. This type of interconnected FinFETs may be used as input/output (IO) MOS devices. In alternative embodiments, the epitaxially grown source or drain region is not connected to the source or drain regions of other FinFETs.

Due to the epitaxial growth, voids (air-gaps) 52 may be formed between STI regions 22 and the overlying epitaxially grown semiconductor materials 46 and 50, wherein voids 52 have a lengthwise direction extending in the lengthwise direction of fins 26 and 28, and extends substantially all the way from one end of semiconductor material 46/50 to the opposite end.

Figure 8:
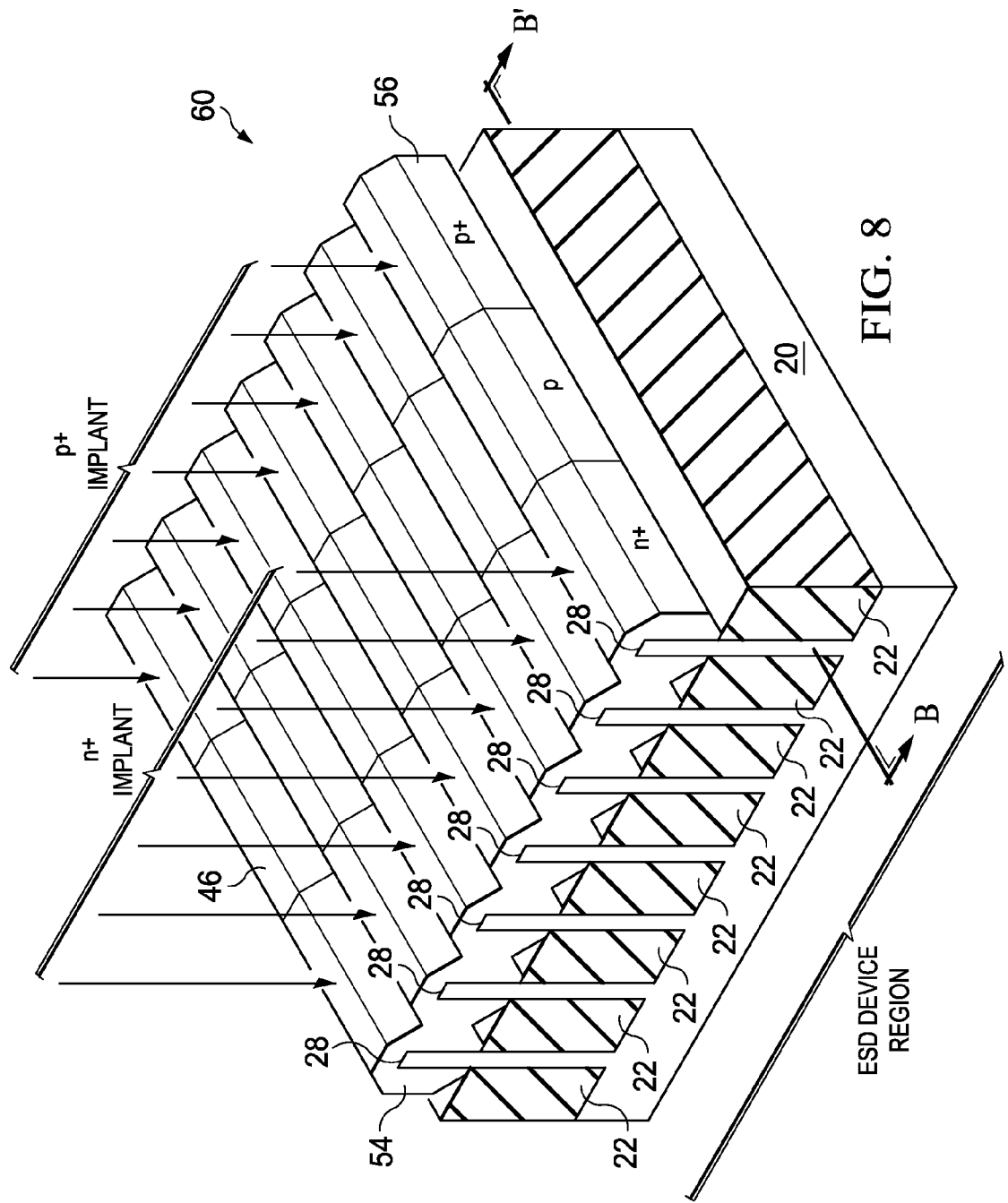
Figure 9:
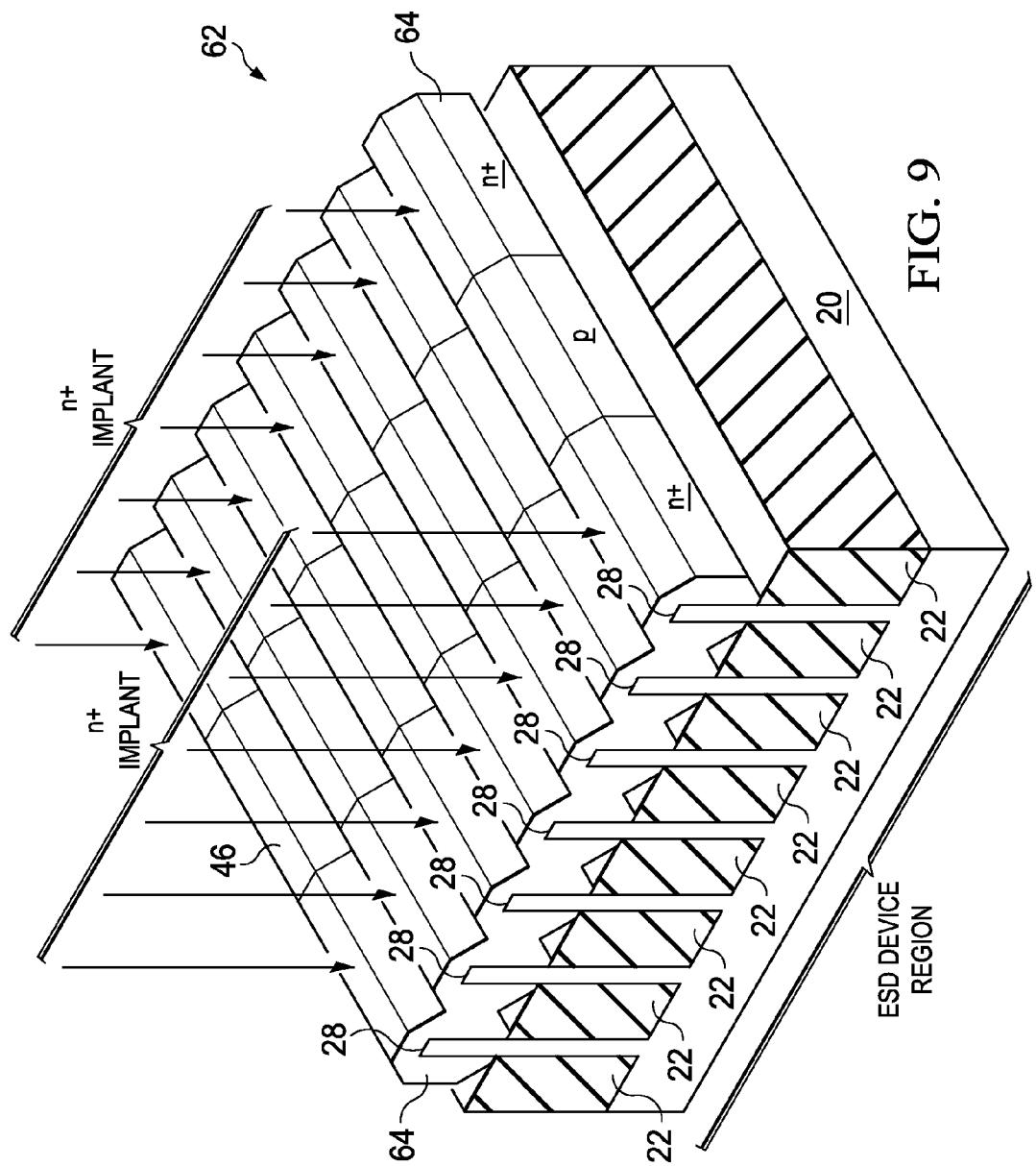

Next, as shown in FIGS. 8 and 9, implantations are formed to form ESD devices. Referring to FIG. 8, assuming semiconductor material 46 is of p-type, an n-type impurity implantation is performed to form heavily doped n-type region 54, and a p-type impurity implantation is performed to form heavily doped p-type region 56. Throughout the description, the term "heavily doped" indicates impurity concentrations of greater than about $10^{20}/cm^3$. However, it is appreciated that the term "heavily doped" is a term of art, and is related to the specific technology generation used for forming the integrated circuits of the embodiments. A portion of the p-type epitaxial material 46 may remain to be un-implanted. Alternatively, epitaxial material 46 is not in-situ doped during its formation, and hence is implanted at this stage. As is known in the art, masks, such as photo resists, may be formed to cover regions not to be implanted. Preferably, the implantation of regions 54 or 56 may be performed simultaneously as the implantation of source and drain regions 50 of the FinFET in the FinFET region. In the resulting structure, a P-N junction is formed between p-type epitaxial material 46 and N+ region 54. Preferably, the P-N junction is perpendicular to the lengthwise direction of fins 28. In alternative embodiments, semiconductor material 46 is of n-type, and hence a P-N junction is formed between the n-type epitaxial material 46 and P+ region 56. The resulting structure is an ESD diode 60.

FIG. 9 illustrates the formation of bipolar junction transistor (BJT) 62, which is also formed by implanting the structure shown in FIGS. 7A through 7C. The process steps for forming BJT 62 is similar to the process steps for forming ESD diode 60, except BJT 62 includes either two N+ regions 64 with a p-type doped region 46 therebetween (hence forming an NPN BJT), or two P+ regions 64 with an n-type doped region 46 therebetween (hence forming a PNP BJT).

At the same time the heavily doped regions 54, 56, and/or 64 are formed, semiconductor regions 50$_1$ and 50$_2$ (refer to FIG. 7C) are implanted, forming source and drain regions of the resulting FinFET.

Figure 10:
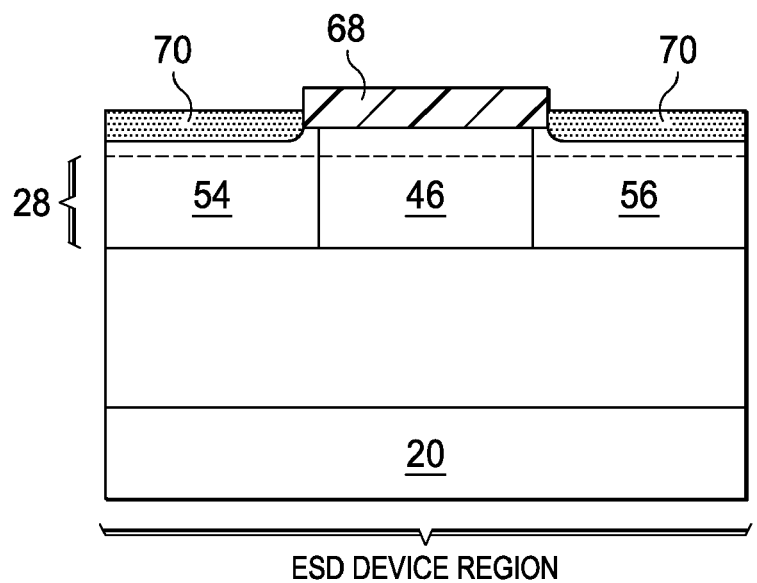

FIG. 10 illustrates a cross-sectional view of the formation of silicide regions on diode 60, wherein the cross-sectional view is taken along a plane crossing line B-B' in FIG. 8. Mask 68, for example, silicon nitride 68, is formed to cover the junction portion of regions 54 and 46. More preferably, mask 68 fully covers semiconductor material 46. A silicidation is then performed. As is known in the art, the silicidation may be performed by blanket depositing a metal layer (not shown), such as nickel, cobalt, or the like, and performing an anneal to react exposed silicon with the overlying metal layer to form silicide regions 70. Un-reacted portion of the metal layer is then removed, leaving silicide regions 70. At the time silicide regions 70 are formed, source/drain silicides (not shown) are also formed on the source and drain regions 50 of the FinFET in the FinFET region.

The silicide regions may also be formed on BJT 62. The process steps are similar to the formation of silicide regions 70, except a pickup region (for example, P+ region) needs to be formed on base 46, and silicide regions are formed on regions 64 and the base pickup region. One skilled in the art will realize the details, and hence the details are not repeated herein.

ESD diode 60, ESD BJT 62 and their formation processes have several advantageous features over conventional FinFET ESD devices. Firstly, the paths for conducting ESD currents include fins 28 and the epitaxially formed semiconductor material 46. Therefore, much higher ESD currents can be conducted compared to conventional ESD devices using only fins for conducting ESD currents. Secondly, since ESD diode 60 or ESD BJT 62 is a single ESD device, instead of multiple ESD devices connected in parallel, the conventional drawback that only some of the multiple ESD devices are turned on, while others remain off, is avoided. Thirdly, the process steps for forming the ESD devices of the present invention are fully compatible with the existing FinFET formation processes, and very few, if any, additional process steps are needed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an electrostatic discharging (ESD) device, the method comprising:
   providing a substrate;
   forming a first and a second semiconductor fin over the substrate and adjacent to each other, wherein each of the first and the second semiconductor fins comprises a first and a second end portions, and a middle portion between the first and the second end portions;
   epitaxially growing a semiconductor material on the first and the second semiconductor fins, wherein a first portion of the semiconductor material grown from the first semiconductor fin joins a second portion of the semiconductor material grown from the second semiconductor fin, and wherein the semiconductor material extends continuously from over the first end portion to second end portion of the first and the second semiconductor fins;
   implanting a first end of the semiconductor material and the first end portion of the first and the second semiconductor fins to form a first implant region; and
   implanting a second end of the semiconductor material and the second end portion of the first and the second semiconductor fins to form a second implant region, wherein a P-N junction is formed between the first end and the second end of the semiconductor material.

2. A method of forming an electrostatic discharging (ESD) device, the method comprising:
   providing a semiconductor substrate;
   forming a first and a second semiconductor fin over the semiconductor substrate, wherein the first and the second semiconductor fins are higher than shallow trench isolation (STI) regions, and are parallel to each other;
   epitaxially growing a semiconductor material on the first and the second semiconductor fins, wherein portions of the semiconductor material grown from the first and the second semiconductor fins adjoin each other to form a continuous semiconductor region, and wherein the semiconductor material grows from substantially entireties of the first and the second semiconductor fins;
   implanting a first end portion of the continuous semiconductor region to a first impurity concentration to form a first implant region; and
   implanting a second end portion of the continuous semiconductor region to a second impurity concentration to form a second implant region, wherein a middle portion of the continuous semiconductor region has an impurity concentration lower than the first and the second impurity concentrations.

3. A method of forming an electrostatic discharging (ESD) device, the method comprising:
   providing a semiconductor substrate having a first region and a second region;
   forming shallow trench isolation (STI) regions in the semiconductor substrate;
   forming a first and a second semiconductor fin over the semiconductor substrate and in the first region, wherein the first and the second semiconductor fins are higher than the STI regions, and are parallel to each other;
   forming a third and a fourth semiconductor fin over the semiconductor substrate and in the second region, wherein the third and the fourth semiconductor fins are higher than the STI regions, and are parallel to each other;
   blanket forming a gate dielectric layer on the first, the second, the third, and the fourth semiconductor fins;
   blanket forming a gate electrode layer on the gate dielectric layer;
   patterning the gate dielectric layer and the gate electrode layer to remove the gate dielectric layer and the gate electrode layer from substantially over an entirety of the first and the second semiconductor fins, wherein a portion of the gate dielectric layer and a portion of the gate electrode layer is left to cover middle portions of the third and the fourth semiconductor fins;
   epitaxially growing a semiconductor material on exposed portions of the first, the second, the third, and the fourth semiconductor fins, wherein portions of the semiconductor material grown from the first and the second semiconductor fins join each other to form a continuous semiconductor region, and portions of the semiconductor material grown from a same end of the third and the fourth semiconductor fins join each other to form a common source/drain region;
   implanting a first end portion of the continuous semiconductor region to form a first implant region;
   implanting a second end portion of the continuous semiconductor region to form a second implant region; and
   implanting the common source/drain region.

4. The method of claim 1 further comprising, before the steps of implanting the first and the second ends of the semiconductor material:
   blanket forming a gate dielectric layer on the first and the second semiconductor fins;

blanket forming a gate electrode layer on the gate dielectric layer; and patterning the gate dielectric layer and the gate electrode layer to remove the gate dielectric layer and the gate electrode layer from over substantially all of the first and the second semiconductor fins.

5. The method of claim 1, wherein the first and the second semiconductor fins are parallel to each other, and wherein a portion of the semiconductor material grown on the middle portion of the first and the second semiconductor fins have a cross-sectional area substantially equal to cross-sectional areas of portions of the semiconductor material grown on the first and the second end portions of the first and the second semiconductor fins, and wherein the cross-sectional area is perpendicular to the first and the second semiconductor fins.

6. The method of claim 1, wherein during the step of epitaxially growing the semiconductor material, an impurity selected from the group consisting essentially of a p-type impurity and an n-type impurity is in-situ doped.

7. The method of claim 1 further comprising:

forming a mask covering a middle portion of the semiconductor material; and forming a first and a second silicide region on the first and the second implant regions, respectively.

8. The method of claim 1, wherein the first and the second implant regions have a same conductivity type.

9. The method of claim 1, wherein the first and the second implant regions have opposite conductivity types.

10. The method of claim 4 further comprising:

forming a third semiconductor fin over the substrate, wherein the third semiconductor fin comprises a source portion, a drain portion, and a gate portion between the source portion and the drain portion;

wherein during the step of patterning the gate dielectric layer and the gate electrode layer, a portion of the gate dielectric layer and a portion of the gate electrode layer are left over the gate portion of the third semiconductor fin; and wherein during the step of epitaxially growing the semiconductor material, no semiconductor material is grown on the gate portion of the third semiconductor fin.

11. The method of claim 2, wherein during the step of epitaxially growing the semiconductor material, voids are formed between the STI regions and the semiconductor material overlying the STI regions.

12. The method of claim 2 further comprising:

blanket forming a gate dielectric layer on the first and the second semiconductor fins;

blanket forming a gate electrode layer on the gate dielectric layer; and patterning the gate dielectric layer and the gate electrode layer to remove the gate dielectric layer and the gate electrode layer from over substantially all of the first and the second semiconductor fins.

13. The method of claim 2, wherein during the step of epitaxially growing the semiconductor material, an impurity selected from the group consisting essentially of a p-type impurity and an n-type impurity is in-situ doped.

14. The method of claim 2 further comprising:

forming a mask covering a middle portion of the semiconductor material; and forming a first and a second silicide region on the first and the second implant regions, respectively.

15. The method of claim 2, wherein the first and the second implant regions have a same conductivity type.

16. The method of claim 2, wherein the first and the second implant regions have opposite conductivity types.

17. The method of claim 16, wherein a middle portion between and adjoining the first and the second end portions of the continuous semiconductor region has an impurity concentration lower than impurity concentrations in the first and the second implant regions.

18. The method of claim 17, wherein the middle portion is in-situ doped during the step of epitaxially growing the semiconductor material.

19. The method of claim 17, wherein the middle portion is doped by an implantation.

* * * * *

UNITED STATES PATENT AND TRADEMARK OFFICE
CERTIFICATE OF CORRECTION

PATENT NO. : 7,700,449 B2  Page 1 of 1
APPLICATION NO. : 12/143644
DATED : April 20, 2010
INVENTOR(S) : Lee It is certified that error appears in the above-identified patent and that said Letters Patent is hereby corrected as shown below:

In Col. 10, line 30, claim 17, delete "16" and insert --3--.

Signed and Sealed this

First Day of June, 2010

David J. Kappos
*Director of the United States Patent and Trademark Office*